United States Patent [19]

Higaki et al.

[11] Patent Number: 4,996,190
[45] Date of Patent: Feb. 26, 1991

[54] SUPERCONDUCTING THIN FILM AND A PROCESS FOR DEPOSITING THE SAME

[75] Inventors: Kenjiro Higaki; Keizo Harada; Naoji Fujimori; Hideo Itozaki; Shuji Yazu, all of Hyogo, Japan

[73] Assignee: Sumitomo Electric Industries, Ltd., Osaka, Japan

[21] Appl. No.: 367,732

[22] Filed: Jun. 19, 1989

[30] Foreign Application Priority Data

Jun. 17, 1988 [JP] Japan .................................. 63-149414

[51] Int. Cl.$^5$ .................................................. B32B 9/00
[52] U.S. Cl. ........................................ 505/1; 505/701; 505/702; 505/703; 505/704; 428/426; 428/432; 428/688; 428/699; 428/700; 428/901; 428/930

[58] Field of Search ........................... 505/1, 701-704; 428/426, 432, 688, 699, 700, 901, 930

[56] References Cited

PUBLICATIONS

Jap. Abs. No. 88-153785, Sumitomo Elec., SC and Thin Films, 12-7-88.

Primary Examiner—Patrick J. Ryan
Attorney, Agent, or Firm—Kerkam, Stowell, Kondracki & Clarke

[57] ABSTRACT

Improvement in a superconducting thin film of a superconducting compound oxide containing bismuth (Bi) deposited on a substrate, characterized in that the superconducting thin film is deposited on {110} plane of a single crystal of magnesium oxide (MgO).

3 Claims, 2 Drawing Sheets

SUPERCONDUCTING THIN FILM AND A PROCESS FOR DEPOSITING THE SAME

BACKGROUND OF THE INVENTION

1. Field of the Invention

The present invention relates to a superconducting thin film and a process for depositing the same on a substrate.

More particularly, it relates to a bismuth (Bi) type superconducting thin film possessing an improved high critical current density (Jc) as well as a high critical temperature (Tc) and a process for depositing the same on a substrate.

2. Description of the Related Art

The superconductivity is a phenomenon which is explained to be a kind of phase change of electrons under which the electric resistance become zero and the perfect dimagnetism is observed.

Several superconducting devices have been proposed and developed in electronics which is a typical field to which the superconducting phenomenon is applicable. A typical application of the superconductor is Josephson device in which quantum efficiency is observed macroscopically when an electric current is passed through a weak junction arranged between two superconductors. The tunnel junction type Josephson device is expected to be a high-speed and low-power consuming switching device owing to smaller energy gap of the superconducting material. It is also expected to utilize the Josephson device as a high-sensitive sensor or detector for sensing very weak magnetic field, microwave, radiant ray or the like since variation of electromagnetic wave or magnetic field is reflected in variation of Josephson effect and can be observed as a precise quantum phenomenon. Development of the superconducting devices such as high-speed logic units or of no power-loss wiring materials is also demanded in the field of high-speed computers in which the power consumption per unit area is reaching to the upper limit of the cooling capacity with increment of the integration density in order to reduce energy consumption. The critical temperature "Tc" of superconductivity, however, could not exceed 23.2 K of $Nb_3Ge$ which was the the highest Tc for the past ten years.

The possibility of an existence of new types of superconducting materials having much higher Tc was revealed by Bednorz and Müller, who discovered a new oxide type superconductor in 1986 (Z. Phys. B64, 1986 p189).

It had been known that certain ceramic materials of compound oxides exhibit the property of superconductivity. For example. U.S. Pat. NO. 3,932,315 discloses Ba-Pb-Bi type compound oxide which shows superconductivity and Japanese patent laid-open No. 60-173,885 discloses that Ba-Bi-Pb type compound oxides also show superconductivity. These superconductors, however, possess rather lower transition temperatures of about 10 K and hence usage of liquidized helium (boiling point of 4.2 K) as cryogen is indispensable to realize superconductivity.

The new type compound oxide superconductor discovered by Bednorz and Müller is represented by $[La,Sr]_2CuO_4$ which is called the $K_2NiF_4$-type oxide having a crystal structure which is similar to known perovskite type oxides, The $K_2NiF_4$-type compound oxides show such higher Tc as 30 K which are extremely higher than known superconducting materials.

It was also reported that C. W. Chu et al. discovered, in the United States of America, another superconducting material so called YBCO type represented by $YBa_2Cu_3O_{7-x}$ having the critical temperature of about 90 K in February 1987 (Physical Review letters, Vol. 58 No. 9, p908).

The other type new superconducting materials which were reported recently are a compound oxide of Bi-Sr-Ca-Cu-O system reported by Maeda et al (Japanese Journal of Applied Physics. Vol. 27, No. 2, p 1209 to 1210) and Tl-Ba-Ca-Cu-O system which exhibit such high Tc as more than 100 K (Hermann et al. Appl. Phys. Lett. 52 (20) p1738) and which are chemically much stable than the abovementioned YBCO type compound oxide or the like. And hence, the possibility of an actual utilization of the high Tc superconductors have burst onto the scene.

The above-mentioned new types superconducting materials were prepared in a bulk form of sintered block which was obtained by sintering a powder mixture of oxides or carbonates of constituent metal elements. They can be deposited on a substrate in a form of a thin film by physical vapour deposition (PVD) technique or chemical vapor deposition (CVD) technique. In both cases, it is a usual practice to subject the resulting sintered blocks or thin films to heat-treated in an oxygen-containing atmosphere to adjust the oxygen deficiency in the crystal.

The present applicant proposed several processes for preparing the thin films of the high-Tc superconductor on a substrate in the following patent applications: U.S. patent application Ser. No. 152,714 filed on Feb. 2, 1988, U.S. patent application Ser. No. 167,895 filed on Mar. 13, 1988, U.S. patent application Ser. No. 195,145 filed on May 18, 1988, U.S. patent application Ser. No. 195,147 filed on May 18, 1988, U.S. patent application Ser. No. 200,206 filed on May 31, 1988, U.S. patent application Ser. No. 286,860 filed on Dec. 20, 1988, U.S. patent application Ser. No. 289,718 filed on Dec. 25, 1988, U.S. patent application Ser. No. 289,719 filed on Dec. 25, 1988, and U.S. patent application Ser. No. 290,309 filed on Dec. 26, 1988 or the like. The present invention completed on the same line as these patent applications.

The present invention concerns the superconducting thin films of bismuth (Bi) type compound oxide. This type superconducting thin film has been prepared by deposition techniques such as RF sputtering, vacuum deposition or MO-CVD technique. They posses, however, very low critical current density (Jc) although they showed very high critical temperature (Tc), so that they were difficult to be utilized in practical uses.

An object of the present invention is to overcome the conventional bismuth (Bi) type superconducting thin films and to improve the critical current density (Jc) and a process for preparing the same.

SUMMARY OF THE INVENTION

The present inventors found such a fact that the critical current density (Jc) of the superconducting thin film of bismuth (Bi) type compound oxide can be improved remarkably when the thin film is deposited on {110} plane of a single crystal of magnesium oxide (MgO) comparing to known thin films prepared by the conventional process in which the thin films is deposited on {100} plane of MgO. In fact, the highest critical current density (Jc) observed in the known thin film of bismuth (Bi) type compound oxide deposited on {100} plane has been about 10,000 A/cm² which is inadequate for practical applications.

Therefore, the present invention provides a superconductor comprising a substrate and a superconducting thin film of a superconducting compound oxide containing bismuth (Bi) deposited on the substrate, characterized in that the superconducting thin film is deposited on {110} plane of a single crystal of magnesium oxide (MgO).

The present invention also provides a process for producing the superconductor. The process according to the present invention for depositing the superconducting thin film of compound oxide containing bismuth (Bi) by vapour deposition on a substrate is characterized in that the superconducting thin film is deposited on {110} plane of a single crystal of magnesium oxide (MgO).

The superconducting thin film according to the present invention consists preferably of a superconducting compound oxide of bismuth (Bi), Strontium (Sr), calcium (Ca) and copper (Cu).

The thin film according to the present invention consists preferably of a superconducting compound oxide represented by the general formula:

$$Bi_4(Sr_{1-x}, Ca_x)_m Cu_n O_{p+y}$$

in which m, n, x and y are numbers each satisfying ranges of

| $6 \leq m \leq 10$, | $4 \leq n \leq 8$ | $0 < x < 1$ | and | $-2 \leq y \leq +2$, | respectively and $p=(6+m+n)$.

More preferably, the atomic ratios are selected within one of following ranges:

| (i) $7 \leq m \leq 9$, | $5 \leq n \leq 7$ | and | $0.4 \leq x \leq 0.6$, |
| (ii) $6 \leq m \leq 7$, | $4 \leq n \leq 5$ | and | $0.2 \leq x \leq 0.4$, |
| (iii) $9 \leq m \leq 10$, | $7 \leq n \leq 8$ | and | $0.5 \leq x \leq 0.7$. |

The superconducting thin film according to the present invention can be deposited on a substrate by physical vapour deposition (PVD) technique such as RF sputtering, vacuum deposition, ion-plating, MBE or chemical vapor deposition (CVD) technique such as thermal CVD, plasma CVD, photo CVD, MOCVD or the like.

The vapour source used in the vapour deposition can consist of elemental bismuth (Bi), strontium (Sr), calcium (Ca) and copper (Cu) and/or compounds thereof, so that bismuth (Bi), strontium (Sr), calcium (Ca) and copper (Cu) are deposited together with oxygen (O) on the substrate to produce the superconducting compound oxide.

The atomic ratios of these elements: Bi, Sr, Ca and Cu are adjusted in such a manner that a thin film deposited on the substrate has a predetermined composition which sows superconductivity with taking evaporation rates and volatility of each elements into consideration.

According to a preferred embodiment, the vapour source is prepared by the steps of mixing powders of compounds of Bi, Sr, Ca and Cu such as their oxides, carbonates, fluorides or the like, subjecting the resulting powder mixture to sintering operation to obtain a sintered mass or block. The sintered mass or powder obtained therefrom can be used directly as a vapour source for vacuum deposition, particularly for sputtering method which is carried out in an oxygen-containing atmosphere.

The vapour source can be divided into a plurality of segments each consisting of elemental metal of Bi, Sr, Ca and Cu or a compound thereof such as their oxides, carbonates, fluorides or the like which can be evaporated by means of a K-cell or an ion beam. This vapour source is preferable for vacuum deposition, ion-plating or molecular beam epitaxy (MBE) methods. In this case, oxygen is supplied, if necessary, separately or additionally into an evaporation atmosphere.

Generally speaking, supplement of oxygen into the evaporation atmosphere is effected either by evaporating oxygen-containing compounds such as oxides, carbonates, fluorides of Bi, Sr, Ca and/or Cu or by supplying oxygen gas separately or additionally into a vacuum chamber. In any case, the oxygen contents in the atmosphere during the deposition of the superconducting thin film must be controlled precisely so that the oxygen deficiency in the thin film deposited on the substrate is adjusted to a predetermined value because the oxygen deficiency in the thin film is a critical factor to realize the superconducting property.

The sputtering for depositing the superconducting thin film according to the present invention is effected preferably under the following conditions: the pressure in a sputtering chamber is preferably within a range between $1.0 \times 10^{-2}$ to $1.0 \times 10^{-1}$ Torr, the sputtering gas is preferably a mixed gas of oxygen and argon whose molar percent of $O^2$ is preferably within a range between 10 to 60 vol. %, the substrate is heated at a temperature between 600 and 850° C., the high-frequency power applied to a target is preferably within a range between 0.064 and 1.27 W/cm², and the thin film is grown at a rate of 0.05 to 1 Å/min.

The resulting thin film deposited on the substrate is preferably subjected to heat-treatment in an oxygen-containing atmosphere. This heat-treatment is effected preferably by such steps that the resulting thin film deposited on the substrate is firstly re-heated at a heating rate of 1 to 5° C./min from ambient temperature to a temperature of 800° to 910° C., is maintained at this temperature for 10 minute to 100 hours, and then is cooled slowly to ambient temperature at a cooling rate of 1°to 5° C./min.

Results of experiments which were carried out by the present inventors revealed such a fact that the crystalline structure of a superconducting thin film of bismuth (Bi) type compound oxide deposited on {110} plane of a single crystal of magnesium oxide (MgO) is much uniform than a superconducting thin film of bismuth (Bi) type compound oxide deposited on {100} plane of the same single crystal and is free from precipitates which is thought to be a cause of hindrance to a flow of electrons. The reason why the thin film according to the present invention possesses a very high current density (Jc) may be explained by the absence or decrement of such precipitation.

In order to obtain the superconducting thin film according to the present invention, it is preferable to operate the sputtering under the above-mentioned sputtering conditions: the pressure in a sputtering chamber is within a range between $1.0 \times 10^{-2}$ to $1.0 \times 10^{-1}$ Torr, the sputtering gas is a mixed gas of oxygen and argon whose molar percent of $O^2$ is within a range between 10 to 60vol. %, the substrate is heated at a temperature between 600° and 850° C., the high-frequency power applied to a target is within a range between 0.064 and 1.27 W/cm$^2$, and the thin film is grown at a rate of 0.05 to 1 Å/min. When the sputtering is effected outside the above-mentioned sputtering conditions, the precipitates increase in and on the thin film, resulting in that both of the critical current density )Jc) and the critical temperature (Tc) become lower.

Preferably, the heat-treatment of the resulting thin film deposited on the substrate in oxygen-containing atmosphere is effected by the above-mentioned steps: the resulting thin film deposited on the substrate is firstly re-heated at a heating rate of 1° to 5° C./min to a temperature of 800 to 910° C., is maintained at this temperature for 10 minutes to 100 hours, and then is cooled slowly to ambient temperature at a cooling rate of 1 to 5° C./min. This heat-treatment accelerate homogenization of crystal structure in the thin film and ensure the oxygen deficiency of the crystal structure. When the heat-treatment is carried out outside the above-mentioned operational conditions, it is difficult to obtain the advantageous effect of the heat-treatment, and in the worst case, the superconducting properties will be deteriorated by the heat-treatment.

As is mentioned above, the evaporation rates and volatility of each constituent elements: Bi, Sr, Ca and Cu must be taken into consideration when the atomic ratios of these elements in the vapour source are adjusted. For example, when the superconducting thin film according to the present invention is prepared by RF-sputtering method by using a single target of sintered mass or sintered powder, the single target has preferably a composition represented by the general formula:

$$Bi_4(Sr_{l-x}, Ca_x)_m Cu_n O_{p+y}$$

in which m, n, x and y are numbers each satisfying range of

| $4 \leq m \leq 8$, | $2 \leq n \leq 6$ | $0 < x < 1$ and | $-2 \leq y \leq +2$, | respectively and p=(6+mn), in order to obtain a thin film of superconducting compound oxide represented by the general formula:

$$Bi_4(Sr_{l-x}, Ca_x)_m Cu_n O_{p+y}$$

in which m, n, x and y are numbers each satisfying range of

| $6 \leq m \leq 10$, | $4 \leq n \leq 8$ | $0 \leq x \leq 1$ and | $-2 \leq y \leq +2$, | respectively and p=(6+m+n), because it is a general tendency that the composition of the thin film obtained deviates from the composition of the target.

The superconducting compound oxide according to the present invention can be utilized advantageously in a variety of applications of thin film devices, such as Matisoo switching elements or Josephson device, Anacker memory device, a variety of sensors or Superconducting Quantum Interference Device (SQUID).

BRIEF DESCRIPTION OF THE DRAWING

FIG. 1 B is a temperature dependency of the critical current density of a superconducting thin film of Bi-Sr-Ca-Cu type compound oxide according to the present invention which is obtained in Example 1.

Now, the present invention will be described with reference to examples, but the scope of the invention should not be limited to them.

EXAMPLE 1

In this example, a superconducting thin film of Bi-Sr-Ca-Cu type compound oxide according to the present invention is prepared by RF-magnetron sputtering method.

A target used in the RF-magnetron sputtering is prepared by the steps of mixing intimately powders of commercially available $BiCO_3$, $SrCO_3$, $CaCO_3$ and CuO in such a manner that the atomic ratios of respective elements Sr, Ca and Cu in the resulting powder mixture become 2.6:2.0:2.0:3.0, subjecting the powder mixture to sintering at 820° C. for 8 hours. The resulting sintered mass of Bi-Sr-Ca-Cu type compound oxide is used as the target.

The RF-magnetron sputtering is effected under the following conditions:

| Substrate | {110} plane of a single crystal of MgO |
|---|---|
| Sputtering gas | a mixed gas of Ar and $O_2$ |
| | $O_2/(Ar + O_2) = 0.2$ (vol) |
| Sputtering pressure | $2 \times 10^{-2}$ Torr |
| Substrate temperature | 750° C. |
| High-frequency power | 50 W (0.64 W/cm$^2$) |

Deposition of a thin film is continued up to a thickness of 4,000 Å. Then, the resulting thin film is heat-treated in an oxygen gas stream. This heat-treatment is effected by the steps of re-heating the thin film deposited on the substrate from ambient temperature to 890° C. at a rate of 3° C./min, maintaining the temperature for one hour and then cooling the thin film slowly down to ambient temperature at a cooling rate of 3° C/min.

The resulting thin film is analyzed to find that the atomic ratios of Bi:Sr:Ca:Cu in the thin film are 2:2:2:3.

For comparison, the same procedure (same target and same operational condition as above) is repeated except that the thin film is deposited on {100} plane of a single crystal of MgO.

The resulting superconducting thin films are evaluated by measuring the critical temperature, the critical current density and by observing their surfaces by a scanning electron microscope (SEM).

The critical temperatures (Tco where the superconducting phenomenon starts to be observed and Tci where the perfect superconductivity is realized) are determined on both samples of thin films by usual four probe method. Temperature is measured by a calibrated Au(Fe)-Ag thermocouple. The critical current density (Jc) of the thin films obtained is also determined at 77.0 K and is expressed by A/cm$^2$. The results are summarized in Table 1.

Figure 1A:
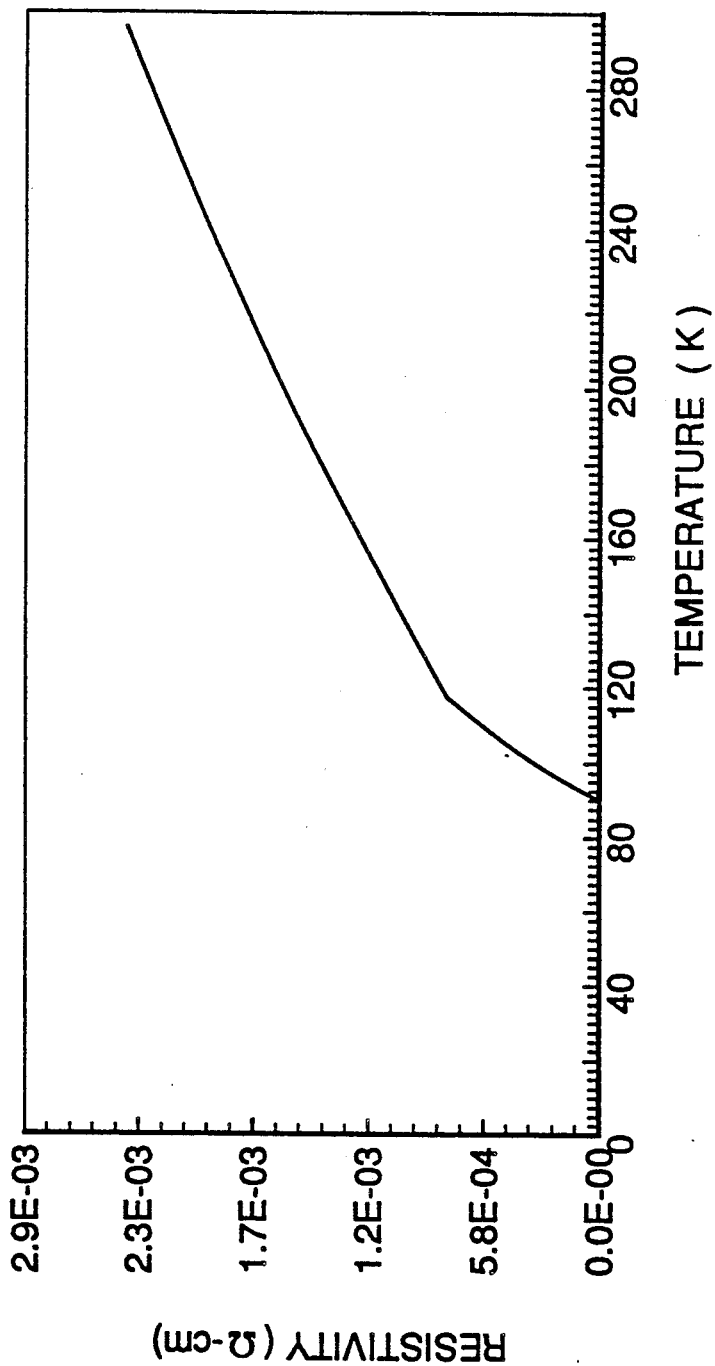
FIG. 1 A is a temperature dependency of resistance of a superconducting thin film of Bi-Sr-Ca-Cu type compound oxide according to the present invention which is obtained in Example 1.
Figure 1B:
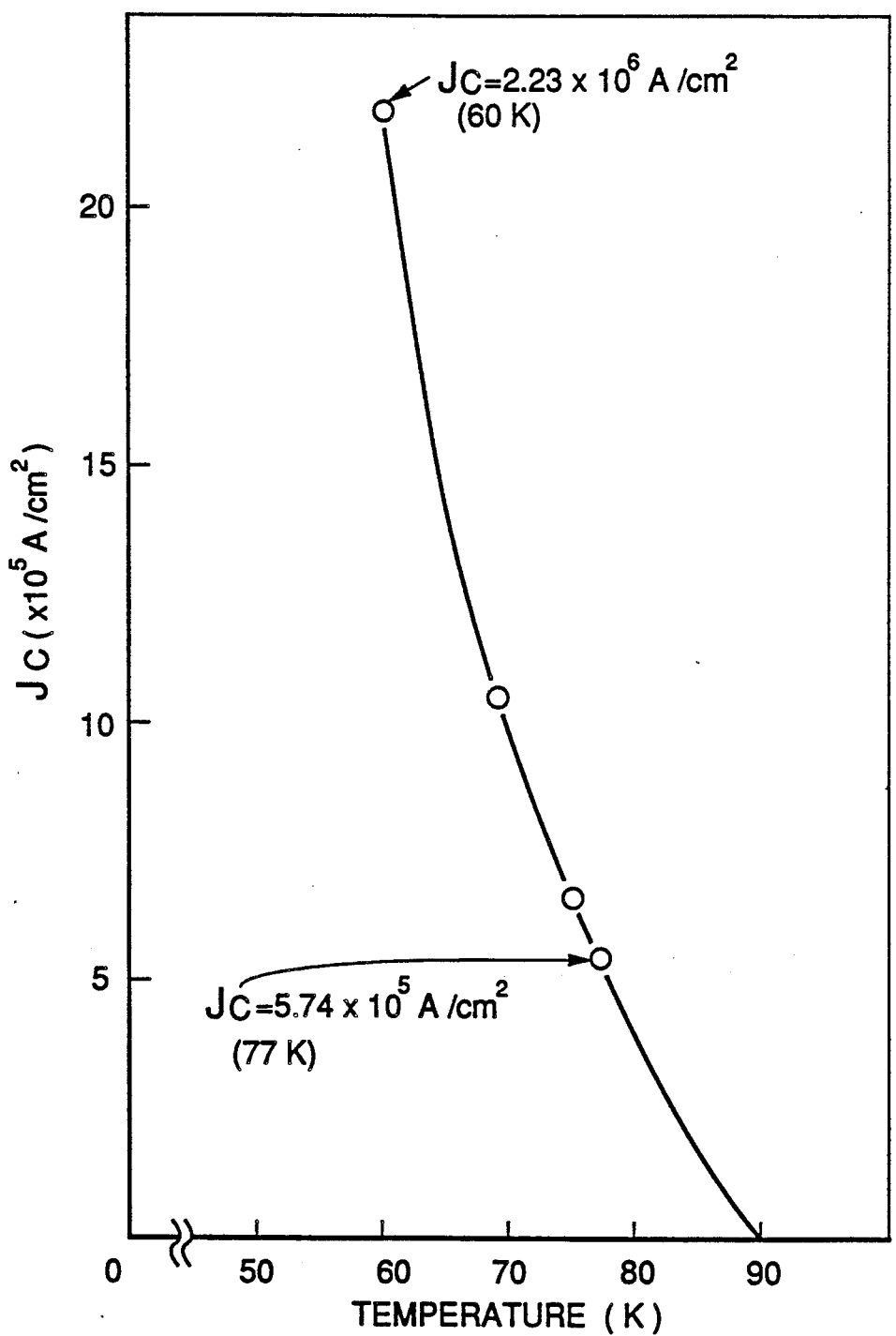

FIG. 1 A and FIG. 1 B show a temperature dependency of resistance and a temperature dependency of the critical current density (Jc) of a superconducting thin film of Bi-Sr-Ca-Cu type compound oxide obtained by Example 1.

EXAMPLE 2

Same operation as Example 1 is repeated except that the atomic ratios of Bi:Sr:Ca:Cu in the powder target is modified to 2.6:2.0:1.0: 2.0.

The resulting thin film is analyzed to find that the atomic ratios of Bi:Sr:Ca:Cu in the thin film are 2:2:1:2.

The superconducting properties of the resulting thin films are determined by the same method as Example 1. The results are summarized in Table 1.

EXAMPLE 3

In this example, a superconducting thin film of Bi-Sr-Ca-Cu type compound oxide according to the present invention is prepared by vacuum deposition method.

A vapour source used in the vacuum deposition is divided into four segments consists of commercially available bismuth (Bi) metal, calcium (Ca) metal, copper (Cu) metal and $SrF_2$. The bismuth (Bi) metal, calcium (Ca) metal and copper (Cu) metal are evaporated in respective K-cell, while $SrF_2$ is evaporated by means of an electron beam (EB) gun. The vacuum deposition is effected under the following conditions:

| | |
|---|---|
| Substrate | {110} plane of a single crystal of MgO |
| Oxygen partial pressure | $2 \times 10^{-6}$ Torr |
| Substrate temperature | 750° C. |
| Film forming rate | 5 Å/sec |

Deposition of a thin film is continued up to a thickness of 4,000 Å. Then, the resulting thin film deposited on the substrate is heat-treated in an oxygen gas stream. This heat-treatment is effected by the steps of re-heating the thin film deposited on the substrate from ambient temperature to 890° C. at a rate of 3° C./min, maintaining the temperature for one hour and then cooling the thin film slowly down to ambient temperature at a cooling rate of 3° C./min.

The resulting thin film is analyzed to find that the atomic ratios Bi:Sr:Ca:Cu in the thin film are 2:2:2:3.

For comparison, the same procedure (same target and same operational condition as above) is repeated except that the thin film is deposited on {100} plane of a single crystal of MgO.

The critical temperatures (Tca and Tci) and the critical current density (Jc) are determined by the same method as Example 1. The results are summarized in Table 1.

EXAMPLE 4

Same operation as Example 3 is repeated except that the amounts of Ca and Cu to be evaporated are reduced in such a manner that the atomic ratios of Bi:Sr:Ca:Cu which is analyzed in the resulting thin film become to 2:2:1:2.

The superconducting properties of the resulting thin films are determined by the same method as Example 1. The results are summarized in Table 1.

TABLE 1

| Example No | | Plane Present invention {110} | Comparative {100} |
|---|---|---|---|
| 1 | Tco (K) | 110 | 115 |
| | Tci (K) | 90 | 100 |
| | Jc (A/cm²) | $5.74 \times 10^5$ | $1.0 \times 10^4$ |
| 2 | Tco (K) | 88 | 88 |
| | Tci (K) | 81 | 80 |
| | Jc (A/cm²) | $1.2 \times 10^4$ | $2.0 \times 10^2$ |
| 3 | Tco (K) | 112 | 115 |
| | Tci (K) | 90 | 98 |
| | Jc (A/cm²) | $3.34 \times 10^5$ | $8.8 \times 10^3$ |
| 4 | Tco (K) | 86 | 85 |
| | Tci (K) | 79 | 79 |
| | Jc (A/cm²) | $1.3 \times 10^4$ | $4.7 \times 10^2$ |

From the results of Examples, it is confirmed that the superconducting thin films according to the present invention possess remarkably higher critical current density (Jc) than the conventional ones.

The surface smoothness of the superconducting thin films obtained is observed by a scanning electron microscope (SEM). The results revealed that the thin film according to the present invention has much homogeneous and uniform smooth surface than the film prepared by the conventional process. This fact is a support of the reason why the thin film according to the present invention possesses higher critical current density.

We claim:

1. A superconductor comprising a substrate and a superconducting thin film of a superconducting compound oxide containing bismuth (Bi) deposited on the substrate, characterized in that said superconducting thin film is deposited on {110} plane of a single crystal of magnesium oxide (MgO).

2. The superconductor set forth in claim 1 wherein said superconducting thin film is composed of a superconducting compound oxide of bismuth (Bi), strontium (Sr), calcium (Ca) and copper (Cu).

3. The superconductor set forth in claim 2 wherein said superconducting thin film is composed mainly of a superconducting compound oxide represented by the general formula:

$$Bi_4(Sr_{1-x}, Ca_x)_m Cu_n O_{p+y}$$

in which m, n, x and y are numbers each satisfying ranges of

| | | | | |
|---|---|---|---|---|
| $6 \leq m \leq 10,$ | $4 \leq n \leq 8$ | $0 \leq x \leq 1$ | and | $-2 \leq y \leq +2,$ | respectively and p=(6+m+n).

* * * * *